(12) United States Patent
Yang et al.

(10) Patent No.: US 9,214,987 B2
(45) Date of Patent: Dec. 15, 2015

(54) NEAR FIELD ANTENNA FOR OBJECT DETECTING DEVICE

(71) Applicant: AUDEN TECHNO CORP., Taoyuan County (TW)

(72) Inventors: Cheng-Min Yang, Kaohsiung (TW); Hsien-Wen Liu, New Taipei (TW)

(73) Assignee: AUDEN TECHNO CORP., Taoyuan County (TW)

( * ) Notice: Subject to any disclaimer, the term of this patent is extended or adjusted under 35 U.S.C. 154(b) by 12 days.

(21) Appl. No.: 14/280,660

(22) Filed: May 18, 2014

(65) Prior Publication Data

US 2015/0333804 A1 Nov. 19, 2015

(51) Int. Cl.
*H04B 5/00* (2006.01)
*H01Q 19/10* (2006.01)
*G01R 1/07* (2006.01)
*G06K 7/10* (2006.01)

(52) U.S. Cl.
CPC ............ *H04B 5/0081* (2013.01); *G01R 1/07* (2013.01); *G06K 7/10336* (2013.01); *H01Q 19/10* (2013.01)

(58) Field of Classification Search
CPC ........ H04B 5/0081; H01Q 19/10; G01R 1/07; G06K 7/10336
USPC ............................ 324/117 R, 144; 455/41.1
See application file for complete search history.

(56) References Cited

U.S. PATENT DOCUMENTS

| 5,617,031 | A * | 4/1997 | Tuttle ............................. 324/326 |
| 5,853,327 | A * | 12/1998 | Gilboa ............................. 463/39 |
| 6,167,353 | A * | 12/2000 | Piernot et al. .................... 702/94 |
| 6,190,174 | B1 * | 2/2001 | Lam ............................... 434/169 |
| 7,843,471 | B2 * | 11/2010 | Doan et al. ...................... 345/633 |
| 8,894,462 | B2 * | 11/2014 | Leyland et al. ................ 446/175 |
| 2003/0171984 | A1 * | 9/2003 | Wodka et al. .................... 705/14 |
| 2005/0237194 | A1 * | 10/2005 | VoBa .......................... 340/572.1 |
| 2009/0203315 | A1 * | 8/2009 | Kawabata et al. ............. 455/41.1 |
| 2013/0065482 | A1 * | 3/2013 | Trickett ......................... 446/397 |
| 2014/0015546 | A1 * | 1/2014 | Frederick ....................... 324/642 |
| 2014/0084857 | A1 * | 3/2014 | Liu et al. ........................ 320/108 |
| 2014/0191715 | A1 * | 7/2014 | Wechlin et al. ................ 320/108 |

* cited by examiner

Primary Examiner — Lewis West
(74) Attorney, Agent, or Firm — Li & Cai Intellectual Property (USA) Office

(57) ABSTRACT

A near field antenna adapted to an object detecting device, for sensing a plurality of units under test of at least an object under test. The near field antenna comprises a periodic guided-wave structure, a metallic reflection portion and at least two near field magnetic coupling antennas. The periodic guided-wave structure disposed below the object under test has a plurality of conductive units periodically arranged on a first plane. The metallic reflection portion is disposed under the periodic guided-wave structure to form an enclosed space. The near field magnetic coupling antennas are disposed on a second plane parallel to the periodic guided-wave structure, and are located in the enclosed space. The feed point and the ground point of each near field magnetic coupling antenna are fed by a coaxial cable with a feeding direction parallel to the periodically arranged conductive units.

14 Claims, 7 Drawing Sheets

NEAR FIELD ANTENNA FOR OBJECT DETECTING DEVICE

BACKGROUND OF THE INVENTION

1. Field of the Invention

The instant disclosure relates to an antenna; in particular, to a near field antenna for object detecting device.

2. Description of Related Art

The radio frequency identification tag (RFID tag) is utilized to be installed to an object for being detected through electromagnetic wave of wireless sensing means, which provides a fast and accurate detecting result. The application may be warehouse management or logistics for example. Radio frequency identification is a wireless communication technology which utilizes a reader and a tag to constitute a RFID system. The RFID reader transmits radio waves, and the RFID tag generates electric current according to electromagnetic induction of the radio waves. The generated electric current is for the operation of the chip (or integrated circuit) in the RFID tag and the RFID tag transmits electromagnetic wave responding to the RFID reader.

The RFID reader is usually designed to detect and read the RFID tags as more as possible. Thus, the near field antenna is usually designed to detect all RFID tags in the predetermined reading space, for example, the RFID tags at different locations and located in different directions could be detected (or read). Accordingly, it raises an issue that the conventional RFID reader could not determine the distance and location of the read RFID tags.

SUMMARY OF THE INVENTION

The object of the instant disclosure is to provide a near field antenna for an object detecting device, in order to detect the placed orientation of a plurality of surfaces of at least an object under test.

In order to achieve the aforementioned objects, according to an embodiment of the instant disclosure, a near field antenna is offered. The near field antenna is utilized for an object detecting device, for sensing a plurality of units under test of at least an object under test. The object under test has a plurality of surfaces. Each surface of the object under test is disposed with at least one unit under test. The near field antenna comprises a periodic guided-wave structure, a metallic reflection portion and two near field magnetic coupling antennas. The periodic guided-wave structure is disposed below the object under test, and has a plurality of conductive units periodically arranged on a first plane. The metallic reflection portion is disposed under the periodic guided-wave structure. The metallic reflection portion and the periodic guided-wave structure forms an enclosed space. The two near field magnetic coupling antennas are disposed on a second plane parallel to the periodic guided-wave structure, and located in the enclosed space formed by the metallic reflection portion and the periodic guided-wave structure. The two near field magnetic coupling antennas are respectively located in two sides of a symmetrical center on the second plane. The distances from each of the near field magnetic coupling antennas to the symmetrical center are the same. Each near field magnetic coupling antenna comprises a plurality of annularly arranged radiators and an annular conductive portion. A first gap is formed between any two adjacent radiators. The annular conductive portion has a plurality of annular conductive segments. Each annular conductive segment partially overlaps two adjacent radiators. A second gap is formed between the two adjacent annular conductive segments and the annular conductive portion surrounding the radiators. The two adjacent radiators are associated with a feed point and a ground point, and the feed point and the ground point are defined in the neighborhood of the first gap between the two adjacent radiators. The feed point and the ground point of one of the two near field magnetic coupling antennas are fed by a first coaxial cable with a first feeding direction. The feed point and the ground point of another one of the two near field magnetic coupling antennas are fed by a second coaxial cable with a second feeding direction. The first feeding direction and the second feeding direction are parallel to the periodically arranged conductive units, and the first feeding direction and the second feeding direction are opposite directions. An angle formed by a line segment connecting the two near field magnetic coupling antennas and the periodically arranged conductive units is between 30 degrees and 50 degrees.

In order to achieve the aforementioned objects, according to an embodiment of the instant disclosure, a near field antenna is offered. The near field antenna is utilized for an object detecting device, for sensing a plurality of units under test of at least an object under test. The object under test has a plurality of surfaces. Each surface of the object under test is disposed with at least one unit under test. The near field antenna comprises a periodic guided-wave structure, a metallic reflection portion and a plurality of near field magnetic coupling antennas. The periodic guided-wave structure is disposed below the object under test, and has a plurality of conductive units periodically arranged on a first plane. The metallic reflection portion is disposed under the periodic guided-wave structure. The metallic reflection portion and the periodic guided-wave structure forms an enclosed space. The plurality of near field magnetic coupling antennas are disposed on a second plane parallel to the periodic guided-wave structure, and located in the enclosed space formed by the metallic reflection portion and the periodic guided-wave structure. Each near field magnetic coupling antenna comprises a plurality of annularly arranged radiators and an annular conductive portion. A first gap formed between any two adjacent radiators. The annular conductive portion has a plurality of annular conductive segments. Each annular conductive segment partially overlaps two adjacent radiators. A second gap is formed between the two adjacent annular conductive segments and the annular conductive portion surrounding the radiators. The two adjacent radiators are associated with a feed point and a ground point, and the feed point and the ground point are defined in the neighborhood of the first gap between the two adjacent radiators. The feed point and the ground point of each near field magnetic coupling antenna are fed by a coaxial cable with a feeding direction, in which the feeding direction is parallel to the periodically arranged conductive units.

In summary, a near field antenna for an object detecting device is provided. The object detecting device could sense the units under test of the device under test through the near field antenna for obtaining the intensities of the sensing signals of the units under test, thus the placed orientation of a plurality of surfaces of at least an object under test could be detected. The provided near field antenna could offer good sensor sensitivity and high sensing accuracy.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

[An Embodiment of the Near Field Antenna]

Figure 1A:
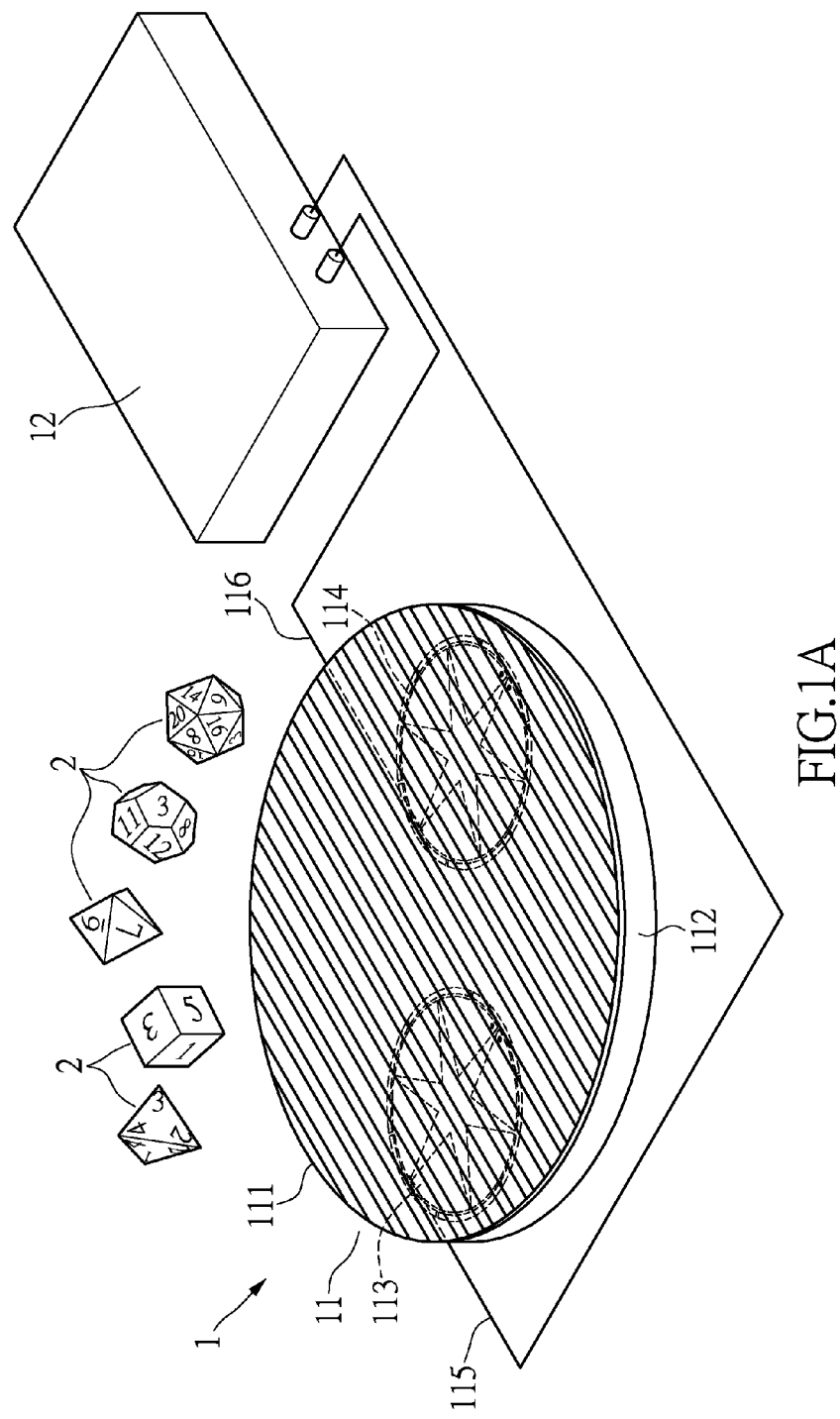
FIG. 1A shows a schematic diagram of an object detecting device according to an embodiment of the instant disclosure.
Figure 1B:
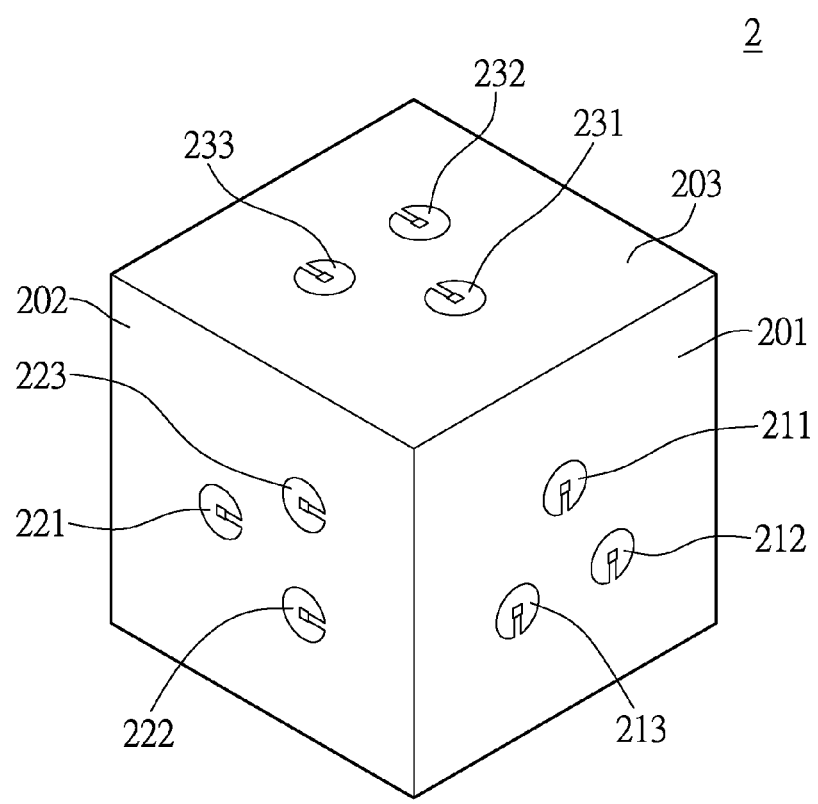
FIG. 1B shows a schematic diagram of an object under test according to an embodiment of the instant disclosure.

Please refer to FIG. 1A in conjunction with FIG. 1B, FIG. 1A shows a schematic diagram of an object detecting device according to an embodiment of the instant disclosure, FIG. 1B shows a schematic diagram of an object under test according to an embodiment of the instant disclosure. The near field antenna 11 is utilized for an object detecting device 1, for sensing a plurality of units under test (referring to the units under test 211, 212, 213, 221, 222, 223, 231, 232, 233) of at least an object under test 2. The units under test may be RFID tags for example. The object detecting device comprises the near field antenna 11 and a detecting unit 12. The detecting unit 12 is connected to the near field antenna 11 through a first coaxial cable 115 and a second coaxial cable 116. The near field antenna 11 comprises a periodic guided-wave structure 111, a metallic reflection portion 112 and two near field magnetic coupling antennas 113, 114. Details of the near field antenna 11 would be described thereafter. The detecting unit 12 transmits the detecting signal and receives the sensing signals through the near field antenna 11. The detecting unit 12 may be a RFID reader having a processor (not shown in the figure) which executes logic operations with the sensing signal from the units under test, in order to detect the placed orientation of a plurality of surfaces of the object under test 2. The detecting unit 12 may comprises signal processing circuits, such as the RF circuit and the control circuit. The detecting unit 12 could read the information of the units under test for identifying the units under test. The detecting unit 12 also determines the relative positions of the plurality of units under test according to the intensities of the received sensing signals, for determining the relative positions of the plurality of units under test, for acquiring the placed orientation of the plurality of surfaces of the object under test 2, such as determining which surface of the dice is the upper surface.

The object under test 2 has a plurality of surfaces. Each surface of the object under test 2 is disposed with at least one unit under test. In this embodiment, a plurality of units under test are disposed on each surface of the object under test 2. The units under test on the same surface of the object under test 2 may have the same orientation. The object under test 2 may be a dice with a shape of the cube, the tetrahedron, the octahedron . . . etc., but the present disclosure is not so restricted. The object under test 2 may be any solid object having a plurality of surfaces, such as a box, a product, a gift box . . . etc.

FIG. 1B exemplary shows the object under test 2 which is a dice with the cubical shape. The surface 201 of the object under test 2 is disposed with the units under test 211, 212, 213, in which the units under test 211, 212, 213 have the same orientation. In the same way, the surface 202 of the object under test 2 is disposed with the units under test 221, 222, 223, in which the units under test 221, 222, 223 have the same orientation. Other units under test on other surfaces of the object under test 2 are arranged in the same way, thus the redundant information is not repeated. Specifically, the general RFID tag has a tag direction. For example, the RFID tag usually has a loop antenna and the feeding current direction (clockwise or counter clockwise) dominates the sensing ability (or the ability being sensed) of the RFID tag in different sensing directions. Thus, in this embodiment, the units under test on the same surface of the object under test 2 have the same orientation. Because the distances between each surface and the near field antenna 11 are not the same, and the orientations of the units under test on each surface are not the same, the intensities of the sensing signals of the units under test receives by the near field antenna 11 would not the same. Accordingly, the detecting unit 12 could determine which unit under test is farther or nearer, in order to determine the actual placed orientation of the object under test 2. Ideally, for the near field antenna 11, the intensities of the sensing signals of the units under test on the same surface may be closed to each other, then cooperating the same orientation of the units under test of the same surface of the object under test 2 in order to give more help to the detecting unit 12 to determine the actual placed orientation of the object under test 2 according to intensities of the received sensing signals. In practical applications, when the object under test 2 is a cubical dice with an edge length of 500 millimeters, the distances between each units under test (which may be three units under test or five unit under test for example) may be preferred to 20 millimeters, but instant disclosure is not so restricted.

Figure 2:
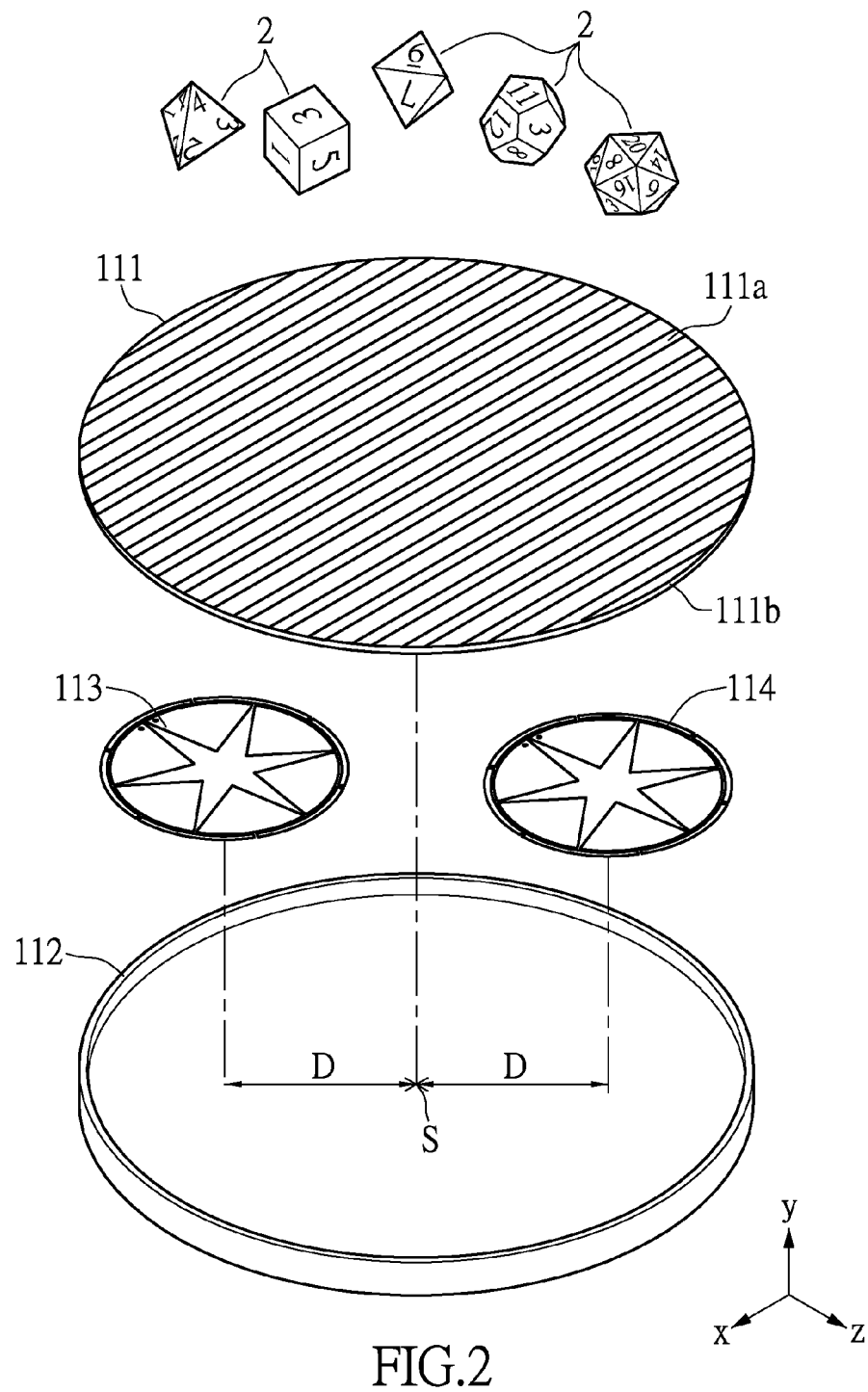
FIG. 2 shows an explosion diagram of a near field antenna according to an embodiment of the instant disclosure.
Figure 3:
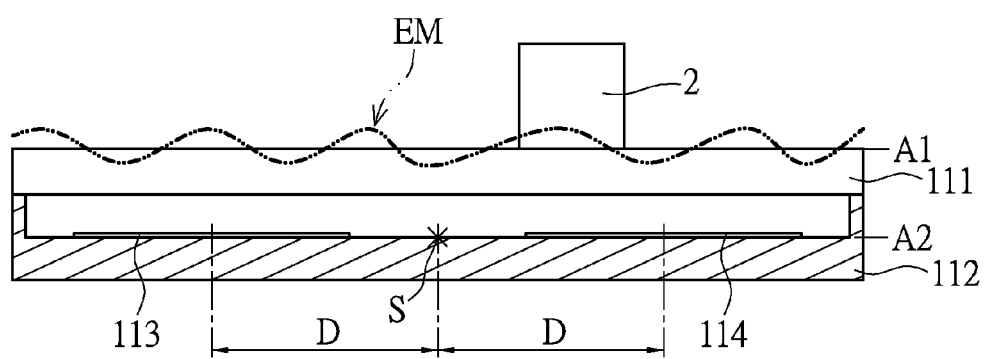
FIG. 3 shows a side view of a near field antenna according to an embodiment of the instant disclosure.

Please refer to FIG. 2 in conjunction with FIG. 3, FIG. 2 shows an explosion diagram of a near field antenna according to an embodiment of the instant disclosure, FIG. 3 shows a side view of a near field antenna according to an embodiment of the instant disclosure. In FIG. 2, the object under test 2 is exemplary shown as a cubical dice. The periodic guided-wave structure 111 is disposed below the object under test 2, and has a plurality of conductive units 111a periodically arranged on a first plane A1 (shown in FIG. 3). The periodic guided-wave structure 111 further comprises a substrate 111b supporting the conductive units 111a. The substrate 111b usually is a nonconductive object which can be penetrated by electromagnetic waves. The metallic reflection portion 112 is disposed under the periodic guided-wave structure 111. The metallic reflection portion 112 and the periodic guided-wave structure 111 forms an enclosed space. The instant disclosure does not limit the shape of the metallic reflection portion 112. The metallic reflection portion 112 is for reflecting the electromagnetic field which is generated by the near field magnetic coupling antennas 113, 114 towards bottom or lower sides. Therefore, the energy transmission direction of the near field antenna would be concentrated to the upper-half space, and the sensing ability of the near field antenna 11 could be improved accordingly.

Taking the object under test 2 shown in FIG. 1B as an example, the units under test on the object under test 2 may be located at any position on any surface of the cubic, that is the distances between any units under test and the periodic guided-wave structure 111 may be different. In other words, not only the detecting unit 12 is for detecting all of the units under test, but also the detecting unit 12 identifies the distances between the units under test and the periodic guided-wave structure 111 according to the intensities of the received sensing signals. It is worth mentioning that, in practical applications, a nonconductive substrate could be disposed on the periodic guided-wave structure 11. The nonconductive is for supporting the object under test 2. That is, the mentioned nonconductive substrate (e.g. a wooden table or an acrylic desktop) is disposed between the object under test 2 and the periodic guided-wave structure 111. The thickness of the nonconductive substrate is preferred to be less than 5 millimeters.

Please refer to FIG. 3, the two near field magnetic coupling antennas 113, 114 are disposed on a second plane A2 parallel to the periodic guided-wave structure 111, and located in the enclosed space formed by the metallic reflection portion 112 and the periodic guided-wave structure 111. The two near field magnetic coupling antennas 113, 114 are respectively located in two sides of a symmetrical center S on the second plane A2. The distances from each of the near field magnetic coupling antennas 113, 114 to the symmetrical center S are the same which is indicated as the distance D.

Referring to FIG. 3 again, in order to describe the instant disclosure in an understandable and clear way, only one object under test 2 is sensed for example. The periodic guided-wave structure 111 is disposed below the object under test 2, and the periodic guided-wave structure 111 may confine the electromagnetic field EM. Thus, the unit(s) under test adhered to the periodic guided-wave structure 111 may be readily be recognized (or identified). The near field magnetic coupling antennas 113, 114 produce electromagnetic field, and when any one of the units under test (RFID Tags) of the object under test 13 receives the electromagnetic field produced by the near field antenna, the unit under test (RFID Tag) may produce electromagnetic field representing the responding signals.

The near field magnetic coupling antennas 113, 114 may produce stronger magnetic field in the aforementioned plane on which the conductive units are arranged (i.e., the H-field). And, the periodic guided-wave structure 111 could confine the electromagnetic field EM on the surface of the periodic guided-wave structure 111.

In this embodiment, the detecting unit 12 may determine which one of the units under test is closer to the periodic guided-wave structure 111 according to the sensed intensity of the responding signals (which is proportional to the magnitude of the electromagnetic field). For example, the near field sensing device 12 may classify the responding signals into two groups according to the intensities of the responding signals, such as a first group which represents the units under test adhered to (or near to) the periodic guided-wave structure 111 and a second group which represents the units under test not adhered to (or far to) the periodic guided-wave structure 111.

The conductive units 111a of the periodic guided-wave structure 111 may be conductive bars in one-dimensional periodic arrangement. The conductive units 111a usually are made by the metal, but the instant disclosure is not restricted thereto. It is worth mentioning that the shape of the conductive units 111a is not limited, as long as the arrangement of the conductive units 111a results in a one-dimensional periodic structure. The shape of the conductive units 111a may lead electric current for guiding the energy of the magnetic field to the surface of the conductive units 111a, thus the identification performance for the units under test adhered to the conductive units 111a could be enhanced. In this embodiment, taking near field magnetic coupling antennas 113, 114 operating in 900 MHz for example, the distance between the conductive units 111 may be preferred from 2 millimeters to 2 centimeters, but the instant disclosure is not restricted thereto. In a preferred embodiment, the distance between two adjacent conductive units 111a may range from 5 millimeters to 10 millimeters, and the width of each of the conductive units 111a may range from 5 millimeters to 10 millimeters, but the instant disclosure is not restricted thereto. Further, the lateral distance between the near field magnetic coupling antennas 113, 114 and the periodic guided-wave structure 111 may be preferred as about 13.9 millimeters.

Figure 4:
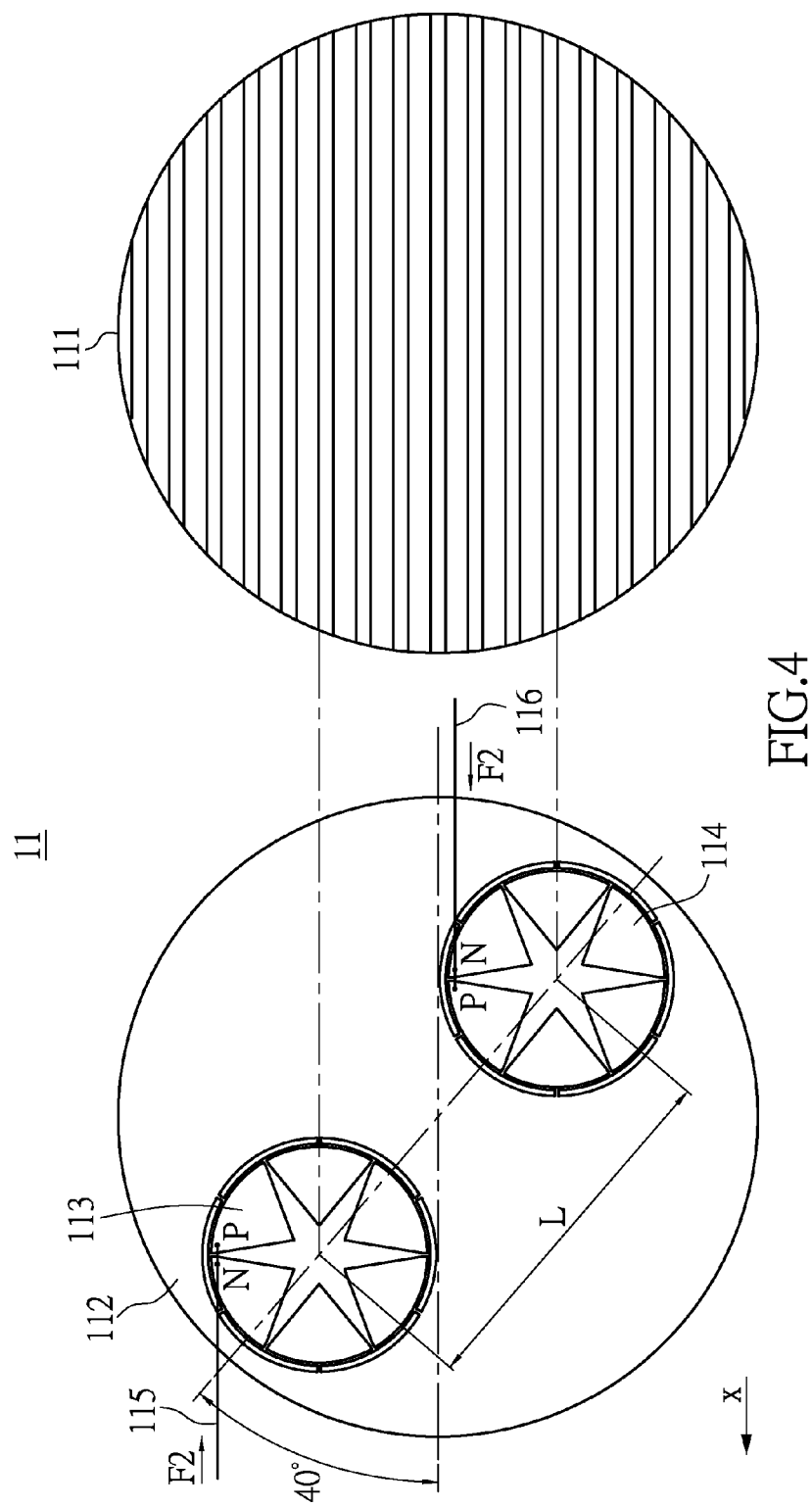
FIG. 4 shows a plan view of a near field antenna according to an embodiment of the instant disclosure.
Figure 5:
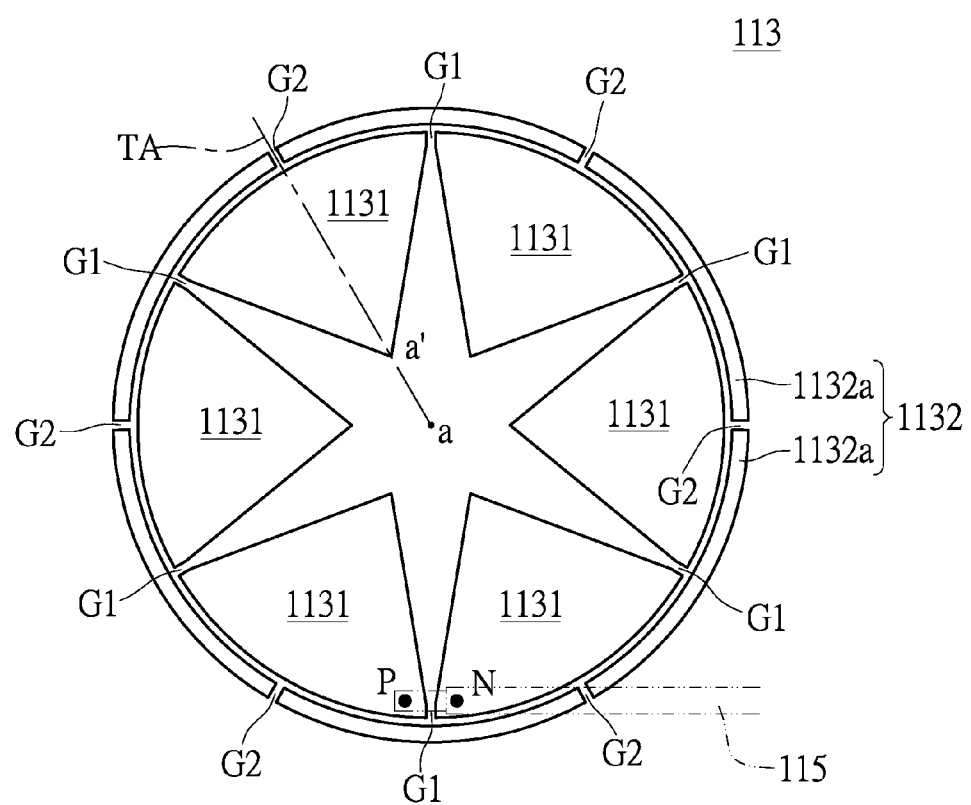
FIG. 5 shows a schematic diagram of a near field magnetic coupling antenna according to an embodiment of the instant disclosure.

Please refer to FIG. 4 in conjunction with FIG. 5, FIG. 4 shows a plan view of a near field antenna according to an embodiment of the instant disclosure, FIG. 5 shows a schematic diagram of a near field magnetic coupling antenna according to an embodiment of the instant disclosure. For the near field magnetic coupling antenna 113, the center conductor and the outer conductor of a first coaxial cable 115 are respectively coupled to a feed point P and a ground point N of the near field magnetic coupling antenna 113. Similarly, for the near field magnetic coupling antenna 114, the center conductor and the outer conductor of a second coaxial cable 116 are respectively coupled to a feed point P and a ground point N of the near field magnetic coupling antenna 114. As shown in FIG. 5, taking the near field magnetic coupling antenna 113 as an example, the near field magnetic coupling antenna 113 comprises a plurality of annularly arranged radiators 1131 and an annular conductive portion 1132. A first gap G1 is formed between any two adjacent radiators 1131. The annular conductive portion 1132 has a plurality of annular conductive segments 1132a. Each annular conductive segment 1132a partially overlaps two adjacent radiators 1131. A second gap G2 is formed between the two adjacent annular conductive segments 1132a and the annular conductive portion 1132 surrounding the radiators 1131. The two adjacent radiators 1131 are associated with the feed point P and the ground point N, and the feed point P and the ground point N are defined in the neighborhood of the first gap G1 between the two adjacent radiators 1131.

Specifically, the number of the annular conductive segments 1132a is equal to the number of the radiators 1131, the radiators 1131 are arranged in a predetermined manner so that a star-shape cavity where no radiators are present is defined, the radiators 1131 are formed by having a disk-shaped conductive plate evenly partitioned at a plurality of predetermined positions so as to define the star-shaped cavity (e.g. the star-shaped cavity shown in FIG. 5 have six outward vertices), with the predetermined positions serving as vertices of the star-shaped cavity, and the annular conductive segments 1132a are evenly partitioned at a plurality of equally-partitioned points, with the number of the equally-partitioned points (which are the positions of the second gap G2) equal to the number of the vertices of the star-shape cavity. The radiators 1131 and the annular conductive portion 1132 of the near field magnetic coupling antenna 113 may be placed on a substrate (not shown in the figure). And in one implementation the substrate may be a printed circuit board. The pattern of the radiators 1131 and the annular conductive portion 1132 may be made on the substrate through an etching process.

The feed point P and the ground point N may be adapted for the receipt of a UHF (Ultra High Frequency) signal, such as a UHF signal at 900 MHz. The first gaps G1 between the annularly arranged radiators 1131 may allow for the two adjacent annularly arranged radiators 1131 to be inductively coupled together. The UHF signal is fed into the two adjacent radiators 1131 through the feed point P and the ground point N, thus the two adjacent radiators 1131 could operate in a resonant mode at a resonant frequency at 900 MHz. Additionally, the magnetic coupling between the annularly arranged radiators 1131 may enable the UHF signal be coupled to the adjacent radiators 1131, exciting the resonant modes associated with similar wavelengths. The annularly arranged radiators 1131 are not restricted to be arranged annularly, when the radiators 1131 may be arranged in an ellipse.

In the embodiment shown in FIG. 5, each of the radiators 1131 has a vertex "a'" facing the center "a" of the disk-shaped conductive plate. Thus, the vertex "a'" may be considered as the inward vertex of the star-shape cavity, while each of the equally-partitioned points (which is the position of the second gaps G2) may be located at a predetermined position that is in the horizontal alignment with the center "a" of the disk-shaped conductive plate and the vertex "a'" of the corresponding radiator 1131 facing the center "a" of the disk-shaped conductive plate (or in other words, the equally-partitioned point, the center of the disk-shaped conductive plate, and the vertex of the radiator 11 may be on the same line TA). The conductive segments 121 may be substantially equal in their length. However, the instant disclosure is not restricted thereto. Each equally-partitioned point may not at the extension line TA and the positions of the equally-partitioned points (e.g. the positions of the second gaps G2) may be deviated from the extension line TA with an angle relative to the center "a." When the positions of the equally-partitioned points are deviated from the extension line TA with an angle relative to the center "a", the magnetic field may be not uniform.

The conductive segments 1132a of the annular conductive portion 1132 and the radiators 1131 may establish capacitive couplings, and the conductive segments 1132a themselves could be treated as being inductive. Besides the vertical magnetic field generated by the near field magnetic coupling antenna 113, an additional magnetic field in transverse distribution may be generated as the result of a reverse current. Thus, the near field magnetic coupling antenna 113 may receive signals from a RFID tag regardless of whether the RFID tag is parallel or perpendicular to the near field magnetic coupling antenna 113. The conductive segments 1132a of the annular conductive portion 1132 and the radiators 1131 may cause the near-field magnetic field to be more uniform and enhance the magnitude of the near-field magnetic field.

In this embodiment, the shapes of the radiators 1131 are not restricted, as long as the radiators 1131 are formed on a disk-shaped conductive plate. The number of the annular arranged radiators 1131 may be four, five, seven, or eight . . . etc., and the instant disclosure is no restricted thereto.

Referring to FIG. 4 again, the near field magnetic coupling antenna 114 is significantly identical to the near field magnetic coupling antenna 113 except for the feeding manner. As shown in FIG. 4, the feed point P and the ground point N of one of the two near field magnetic coupling antennas 113, 114 (for example, the near field magnetic coupling antenna 113) are fed by the first coaxial cable 115 with a first feeding direction F1. The feed point P and the ground point N of another one of the two near field magnetic coupling antennas 113, 114 (for example, the near field magnetic coupling antenna 114) are fed by the second coaxial cable 116 with a second feeding direction F2. The first feeding direction F1 and the second feeding direction F2 are parallel to the periodically arranged conductive units 111a, and the first feeding direction F1 and the second feeding direction F2 are opposite directions. Opposite feeding directions (F1 and F2) result the excited current of the near field magnetic coupling antenna 113 be opposite to the excited current of the near field magnetic coupling antenna 114, thus the near field magnetic coupling antennas 113, 114 could produce radiations with different polarization, in order to improve the accuracy of reading the sensing signals. An angle formed by a line segment connecting the two near field magnetic coupling antennas 113, 114 and the periodically arranged conductive units is preferred between 30 degrees and 50 degrees. For example, the angle shown in FIG. 4 is 40 degrees, and the better accuracy of reading the sensing signals could be obtained.

[Another Embodiment of the Near Field Antenna]

Figure 6:
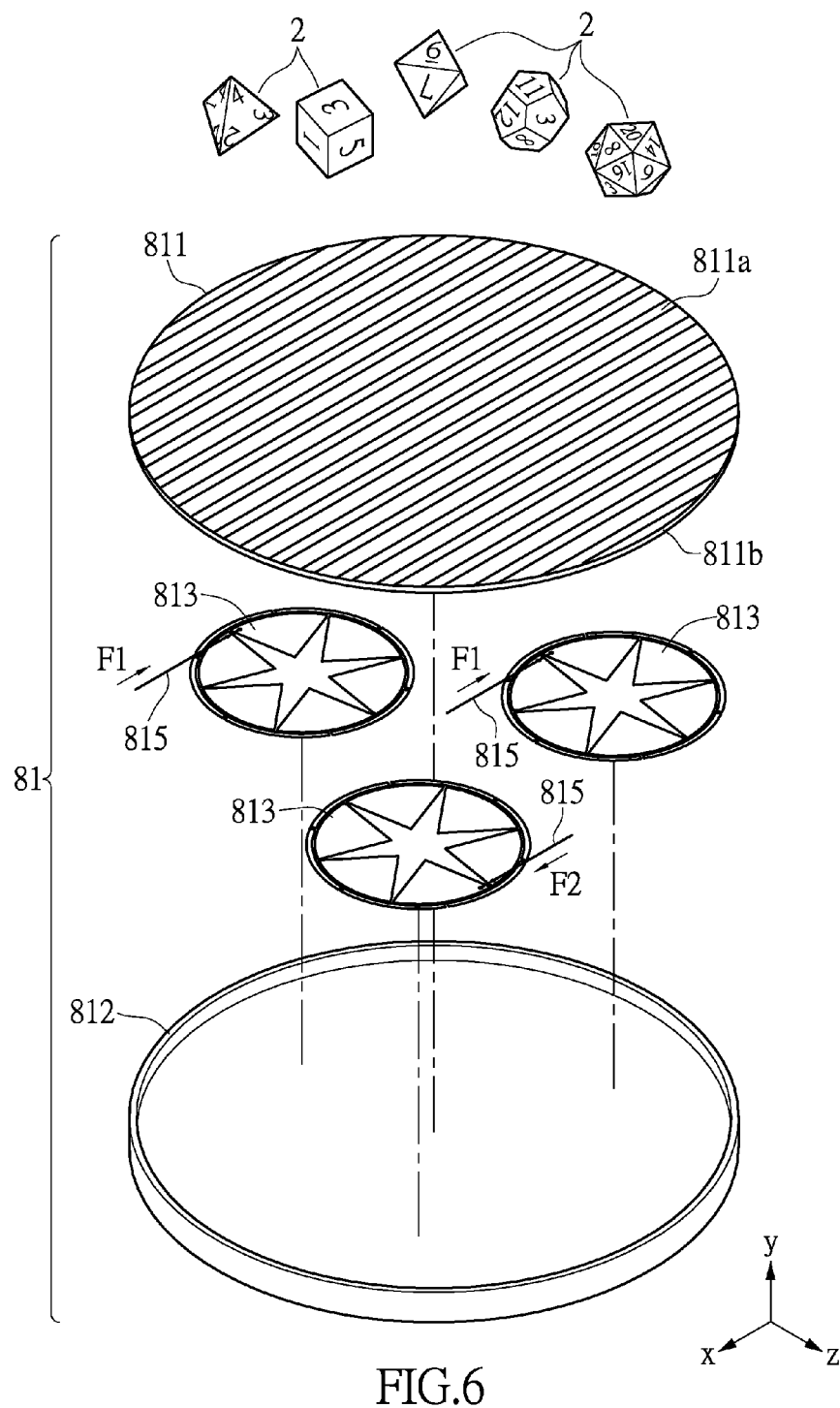
FIG. 6 shows a schematic diagram of a near field antenna according to another embodiment of the instant disclosure.

Please refer to FIG. 6 showing a schematic diagram of a near field antenna according to another embodiment of the instant disclosure. A near field antenna 81 is utilized for sensing a plurality of units under test of at least an object under test 2. The object under test 2 has a plurality of surfaces. Each surface of the object under test 2 is disposed with at least one unit under test. The near field antenna 81 comprises a periodic guided-wave structure 811, a metallic reflection portion 812 and a plurality of near field magnetic coupling antennas 813. Three near field magnetic coupling antennas 813 shown in FIG. 6 is an example, but the number of the near field magnetic coupling antennas 813 is not so restricted. The periodic guided-wave structure 811 is disposed below the object under test 2, and has a plurality of conductive units 811a periodically arranged on a first plane (the surface of the substrate 811b). The metallic reflection portion 812 is disposed under the periodic guided-wave structure 811. The metallic reflection portion 812 and the periodic guided-wave structure 811 forms an enclosed space. The plurality of near field magnetic coupling antennas 813 are disposed on a second plane (which is the same as the second plane A2 shown in FIG. 3) parallel to the periodic guided-wave structure 811, and located in the enclosed space formed by the metallic reflection portion 812 and the periodic guided-wave structure 811. In this embodiment, the position of the near field magnetic coupling antenna 813 is not restricted to the second surface A2 shown in FIG. 3. The near field magnetic coupling antenna 813 is the same as the near field magnetic coupling antenna 113 shown in FIG. 5, thus the redundant information is not repeated. The near field antenna 81 is significantly identical to the near field antenna 11 shown in FIG. 1A except for the number of the near field magnetic coupling antennas 813 which may be plural. The feed point P and the ground point N of each near field magnetic coupling antenna 813 are fed by a coaxial cable 815 with a feeding direction which is the first feeding direction F1 or the second feeding direction F2, in which the feeding direction is parallel to the periodically arranged conductive units 811a of the periodic guided-wave structure 811. This instant disclosure does not restrict that the feeding direction of the near field magnetic coupling antennas 813 is the first feeding direction F1 or the second feeding direction F2, as long as the feeding direction is parallel to the periodically arranged conductive units 811a (which is arranged along the X axis shown in FIG. 6) of the periodic guided-wave structure 811.

According to above descriptions, a near field antenna for an object detecting device is provided. The object detecting device could sense the units under test of the device under test through the near field antenna for obtaining the intensities of the sensing signals of the units under test, thus the placed orientation of a plurality of surfaces of at least an object under test could be detected. The provided near field antenna could offer good sensor sensitivity and high sensing accuracy. The near field antenna could be applied to dice detection, for example a game object detection system. Or, the near field antenna could be applied to detect any solid object.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A near field antenna utilized for an object detecting device, for sensing a plurality of units under test of at least an object under test, the object under test having a plurality of surfaces, each surface of the object under test disposed with at least one unit under test, the near field antenna comprising:
a periodic guided-wave structure, disposed below the object under test, having a plurality of conductive units periodically arranged on a first plane;
a metallic reflection portion, disposed under the periodic guided-wave structure, the metallic reflection portion and the periodic guided-wave structure forming an enclosed space; and
two near field magnetic coupling antennas, disposed on a second plane parallel to the periodic guided-wave structure, located in the enclosed space formed by the metallic reflection portion and the periodic guided-wave structure, the two near field magnetic coupling antennas respectively located in two sides of a symmetrical center on the second plane, the distances from each of the near field magnetic coupling antennas to the symmetrical center being the same, each near field magnetic coupling antenna comprising:
a plurality of annularly arranged radiators, with a first gap formed between any two adjacent radiators; and
an annular conductive portion, having a plurality of annular conductive segments, each annular conductive segment partially overlapping two adjacent radiators, with a second gap formed between the two adjacent annular conductive segments and the annular conductive portion surrounding the radiators;
wherein the two adjacent radiators are associated with a feed point and a ground point, and the feed point and the ground point are defined in the neighborhood of the first gap between the two adjacent radiators;
wherein the feed point and the ground point of one of the two near field magnetic coupling antennas are fed by a first coaxial cable with a first feeding direction, the feed point and the ground point of another one of the two near field magnetic coupling antennas are fed by a second coaxial cable with a second feeding direction, the first feeding direction and the second feeding direction are parallel to the periodically arranged conductive units, and the first feeding direction and the second feeding direction are opposite directions;
wherein an angle formed by a line segment connecting the two near field magnetic coupling antennas and the periodically arranged conductive units is between 30 degrees and 50 degrees.

2. The near field antenna according to claim 1, wherein the number of the annular conductive segments is equal to the number of the radiators, the radiators are arranged in a predetermined manner so that a star-shape cavity where no radiators are present is defined, the radiators are formed by having a disk-shaped conductive plate evenly partitioned at a plurality of predetermined positions so as to define the star-shaped cavity, with the predetermined positions serving as vertices of the star-shaped cavity, and the annular conductive segments are evenly partitioned at a plurality of equally-partitioned points, with the number of the equally-partitioned points equal to the number of the vertices of the star-shape cavity.

3. The near field antenna according to claim 2, wherein the equally-partitioned point is located at a predetermined position in horizontal alignment with a center of the disk-shaped conductive plate and a vertex of the radiator.

4. The near field antenna according to claim 1, further comprising:
a nonconductive substrate, disposed on the periodic guided-wave structure, the nonconductive being for supporting the object under test, the thickness of the nonconductive substrate being less than 5 millimeters.

5. The near field antenna according to claim 1, wherein each surface of the object under test is disposed with a plurality of units under test, the units under test on the same surface of the object under test have the same orientation.

6. The near field antenna according to claim 1, wherein the feed point and the ground point are for feeding a UHF (Ultra High Frequency) signal.

7. The near field antenna according to claim 2, wherein the number of the vertices of the star-shaped cavity is more than three.

8. A near field antenna utilized for an object detecting device, for sensing a plurality of units under test of at least an object under test, the object under test having a plurality of surfaces, each surface of the object under test disposed with at least one unit under test, the near field antenna comprising:
a periodic guided-wave structure, disposed below the object under test, having a plurality of conductive units periodically arranged on a first plane;
a metallic reflection portion, disposed under the periodic guided-wave structure, the metallic reflection portion and the periodic guided-wave structure forming an enclosed space; and
a plurality of near field magnetic coupling antennas, disposed on a second plane parallel to the periodic guided-wave structure, located in the enclosed space formed by the metallic reflection portion and the periodic guided-wave structure, each near field magnetic coupling antenna comprising:
a plurality of annularly arranged radiators, with a first gap formed between any two adjacent radiators; and
an annular conductive portion, having a plurality of annular conductive segments, each annular conductive segment partially overlapping two adjacent radiators, with a second gap formed between the two adjacent annular conductive segments and the annular conductive portion surrounding the radiators;
wherein the two adjacent radiators are associated with a feed point and a ground point, and the feed point and the ground point are defined in the neighborhood of the first gap between the two adjacent radiators;
wherein the feed point and the ground point of each near field magnetic coupling antenna are fed by a coaxial cable with a feeding direction, the feeding direction is parallel to the periodically arranged conductive units.

9. The near field antenna according to claim 8, wherein the number of the annular conductive segments is equal to the number of the radiators, the radiators are arranged in a predetermined manner so that a star-shape cavity where no radiators are present is defined, the radiators are formed by having a disk-shaped conductive plate evenly partitioned at a plurality of predetermined positions so as to define the star-shaped cavity, with the predetermined positions serving as vertices of the star-shaped cavity, and the annular conductive segments are evenly partitioned at a plurality of equally-partitioned points, with the number of the equally-partitioned points equal to the number of the vertices of the star-shape cavity.

10. The near field antenna according to claim 9, wherein the equally-partitioned point is located at a predetermined position in horizontal alignment with a center of the disk-shaped conductive plate and a vertex of the radiator.

11. The near field antenna according to claim 8, further comprising:
- a nonconductive substrate, disposed on the periodic guided-wave structure, the nonconductive being for supporting the object under test, the thickness of the nonconductive substrate being less than 5 millimeters.

12. The near field antenna according to claim 8, wherein each surface of the object under test is disposed with a plurality of units under test, the units under test on the same surface of the object under test have the same orientation.

13. The near field antenna according to claim 8, wherein the feed point and the ground point are for feeding a UHF (Ultra High Frequency) signal.

14. The near field antenna according to claim 9, wherein the number of the vertices of the star-shaped cavity is more than three.

* * * * *